United States Patent [19]

Takenaka et al.

[11] Patent Number: 5,407,502
[45] Date of Patent: Apr. 18, 1995

[54] METHOD FOR PRODUCING A SEMICONDUCTOR DEVICE HAVING AN IMPROVED ADHESIVE STRUCTURE

[75] Inventors: Takeshi Takenaka; Toshio Hamano, both of Kawasaki; Takekiyo Saito, Yokohama, all of Japan

[73] Assignee: Fujitsu Limited, Kawasaki, Japan

[21] Appl. No.: 121,902

[22] Filed: Sep. 16, 1993

Related U.S. Application Data

[60] Division of Ser. No. 48,210, Apr. 20, 1993, Pat. No. 5,278,429, which is a continuation of Ser. No. 628,519, Dec. 17, 1990, abandoned.

[30] Foreign Application Priority Data

| Dec. 19, 1989 [JP] | Japan | 1-329244 |
| Dec. 25, 1989 [JP] | Japan | 1-337585 |
| Aug. 23, 1990 [JP] | Japan | 2-221809 |

[51] Int. Cl.⁶ ............ H05K 5/03; H05K 5/06; H05K 13/04; C03C 17/34
[52] U.S. Cl. ............ 156/89; 156/292; 437/209; 437/215; 29/841
[58] Field of Search ............ 156/89, 292; 437/212, 437/215, 216, 209; 29/841

[56] References Cited

U.S. PATENT DOCUMENTS

| 2,628,921 | 2/1953 | Weinrich | 427/294 X |
| 3,091,548 | 5/1963 | Dillon, II | 156/89 X |
| 3,468,752 | 9/1969 | Yamamoto et al. | 156/89 X |
| 3,518,756 | 7/1970 | Bennett et al. | 427/292 X |
| 3,622,384 | 11/1971 | Davey et al. | 29/625 X |
| 3,669,715 | 6/1972 | Meyer | 427/292 X |
| 3,993,844 | 11/1976 | Kiger et al. | 156/89 X |
| 4,055,451 | 10/1977 | Cockbain et al. | 156/89 |
| 4,170,688 | 10/1979 | Roentgen et al. | 156/89 X |
| 4,323,405 | 4/1982 | Uno et al. | 156/89 X |
| 4,356,047 | 10/1982 | Gordon et al. | 156/89 |
| 4,537,863 | 8/1985 | Matsuura et al. | 501/15 |
| 4,704,626 | 11/1987 | Mahulikar et al. | 257/729 |
| 4,827,082 | 5/1989 | Horiuchi et al. | 174/52.4 |
| 4,888,449 | 12/1989 | Crane et al. | 174/52.4 |

FOREIGN PATENT DOCUMENTS

| 60-239044 | 11/1985 | Japan. |
| 62-45154 | 2/1987 | Japan. |
| 62-79635 | 4/1987 | Japan. |
| 62-285456 | 12/1987 | Japan. |
| 3-21046 | 1/1991 | Japan. |

OTHER PUBLICATIONS

Patent Abstracts of Japan, vol. 11, No. 195 (E-518) (2642), Jun. 23, 1987, JP-A-62-022459.
Patent Abstracts of Japan, vol. 11, No. 376 (E-563) (2823), Dec. 8, 1987, JP-A-62-145750.
Patent Abstracts of Japan, vol. 10, No. 313 (E-448) (2369), Oct. 24, 1986, JP-A-61-125052.
Patent Abstracts of Japan, vol. 12, No. 268 (E-638), Jul. 27, 1988, JP-A-63-052447.
Patent Abstracts of Japan, vol. 11, No. 130 (E-502) (2577), Apr. 23, 1987, JP-A-61-276239.
Patent Abstracts of Japan, vol. 11, No. 88 (E-490), Mar. 18, 1987, JP-A-61-241952.

*Primary Examiner*—Michael W. Ball
*Assistant Examiner*—Francis J. Lorin
*Attorney, Agent, or Firm*—Nikaido, Marmelstein, Murray & Oram

[57] ABSTRACT

A method is provided wherein semiconductor device includes a package, a semiconductor chip provided on the package, an intermediate layer formed on the package, an adhesive layer formed on the intermediate layer, and a lid formed on the adhesive layer and sealing the semiconductor chip. The intermediate layer contains a major component which is the same as a major component of the package. The method includes screen printing the intermediate layer on a predetermined area of the package and the formation of a roughened surface by sintering the intermediate layer. The major component comprises, among other materials, alumina or alumina and glass.

3 Claims, 6 Drawing Sheets

METHOD FOR PRODUCING A SEMICONDUCTOR DEVICE HAVING AN IMPROVED ADHESIVE STRUCTURE

This is a division of application Ser. No. 08/048,210, filed Apr. 20, 1993, now U.S. Pat. No. 5,278,829, which in turn is a continuation of application Ser. No. 07/628,519, filed Dec. 17, 1990, now abandoned.

BACKGROUND OF THE INVENTION

The present invention generally relates to a semiconductor device, and more particularly to an improvement in adhering structural elements, such as a package and a cover, to each other. Further, the present invention is concerned with a method of producing such a semiconductor device.

Recently, semiconductor chips of large sizes have been used in order to realize a high integration density. As the semiconductor chip size increases, a package which accommodates a semiconductor chip also increases. A lid (which is also referred to cap or cover) is, for example, adhered to a stage surface of the package by an adhesive. It is necessary to obtain a sufficient strength of an adhesive portion between the package and the lid, particularly when the package accommodates a large-size semiconductor chip.

Referring to FIG. 1, there is illustrated a conventional frit seal type semiconductor device 1. FIG. 2 is an enlarged diagram of a portion surrounded by the chain line shown in FIG. 1. The semiconductor device 1 is composed of a ceramic package 2, a semiconductor chip 3 on which integrated circuits are formed, a lid 4 and a glass layer 5. The ceramic package 2 has a recess portion in which the semiconductor chip 3 is accommodated. The lid 4 is adhered to a stage (upper) surface of the ceramic package 2 by the glass layer 5. Generally, as the chip size increases, a weight applied to the lid 4 is varied in order to improve reliability of sealing the semiconductor device.

The applicants conducted a thermal shock test based on an MIL standard, MIL-STD-883C 1011 COND.A, in which samples of the semiconductor device 1 shown in FIG. 1 are alternately placed into a chamber maintained at 0° C. and a chamber at 100° C. The results of the thermal shock test are shown in Table 1, which will be shown later. When the thermal shock operation was repeatedly carried out about 300 times, a crack took place in a portion of the glass layer 5 along a peripheral edge of the lid 4 of each of all the samples. This means that the adhesive strength between the glass layer 5 and the ceramic package 2 is not sufficient and the adhesive portion is weak in thermal shocks.

The reasons are considered as follows. The stage surface 2a of the ceramic package 2 has a roughness between about 0.3 and 0.4 when it is expressed by a center line average roughness Ra. As is known, the center line average roughness Ra is defined as $Ra=(1/l)\int_o^l |f(x)| dx$ where x represents the direction of a center line, 1 is a measurement length, and f(x) (=y) is a roughness curve. Thus, a sufficient anchoring effect is not obtained. A meniscus portion 5a (peripheral taper portion) of the glass layer 5 is a convex portion. As a result, a portion of the glass layer 5 outward extending from the edge of the lid 4 does not meet or exceed a sufficient length 'a', and thus the adhesion area is small. Further, the difference between the coefficient of thermal expansion of the ceramic package 2 and the coefficient of thermal expansion of the glass layer 5 affects the occurrence of cracks. Similar problems occur between the semiconductor chip 3 and the package 2.

SUMMARY OF THE INVENTION

It is a general object of the present invention to provide an improved semiconductor device in which the above-mentioned disadvantages are eliminated.

A more specific object of the present invention is to provide a semiconductor device in which an adhesive portion between a lid and a package has an increased adhesion strength so that the semiconductor device is resistant to thermal shocks.

The above-mentioned objects of the present invention are achieved by a semiconductor device comprising: a package; a semiconductor chip provided on the package; a first intermediate layer formed on the package; an adhesive layer formed on the first intermediate layer; and a lid formed on the adhesive layer and sealing the semiconductor chip, wherein the first intermediate layer contains a major component which is the same as a major component of the package.

Another object of the present invention is to provide a semiconductor device in which an adhesive portion between a semiconductor chip and a package has an increased adhesion strength so that the semiconductor device is resistant to thermal shocks.

This object of the present invention is achieved by a semiconductor device comprising: a package; an intermediate layer formed on the package; an adhesive layer formed on the intermediate layer; a semiconductor chip formed on the adhesive layer; and a lid fixed on the package and sealing the semiconductor chip, wherein the intermediate layer contains a major component which is the same as a major component of the package.

Still another object of the present invention is to provide a method of producing a semiconductor device having an intermediate layer such as the above.

This object of the present invention is achieved by a method of producing a semiconductor device, comprising the steps of: forming, by a screen printing process, a paste on a predetermined area of a package on which a semiconductor chip is mounted, the paste having a major component which is the same as that of the package; sintering the paste at a predetermined temperature, so that an intermediate layer is formed on the predetermined area of the package; and adhering a lid to the intermediate layer by using an adhesive provided between the intermediate layer and the lid.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3:
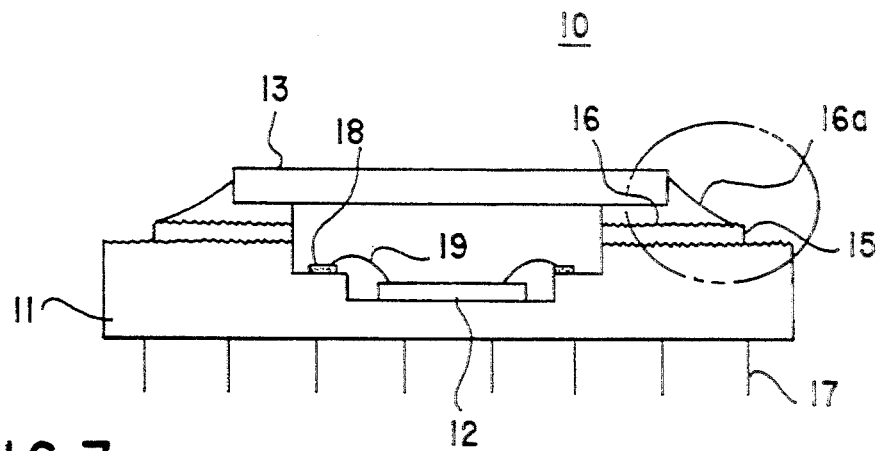
FIG. 3 is a cross-sectional view of a semiconductor device according to a first preferred embodiment of the present invention.
Figure 4:
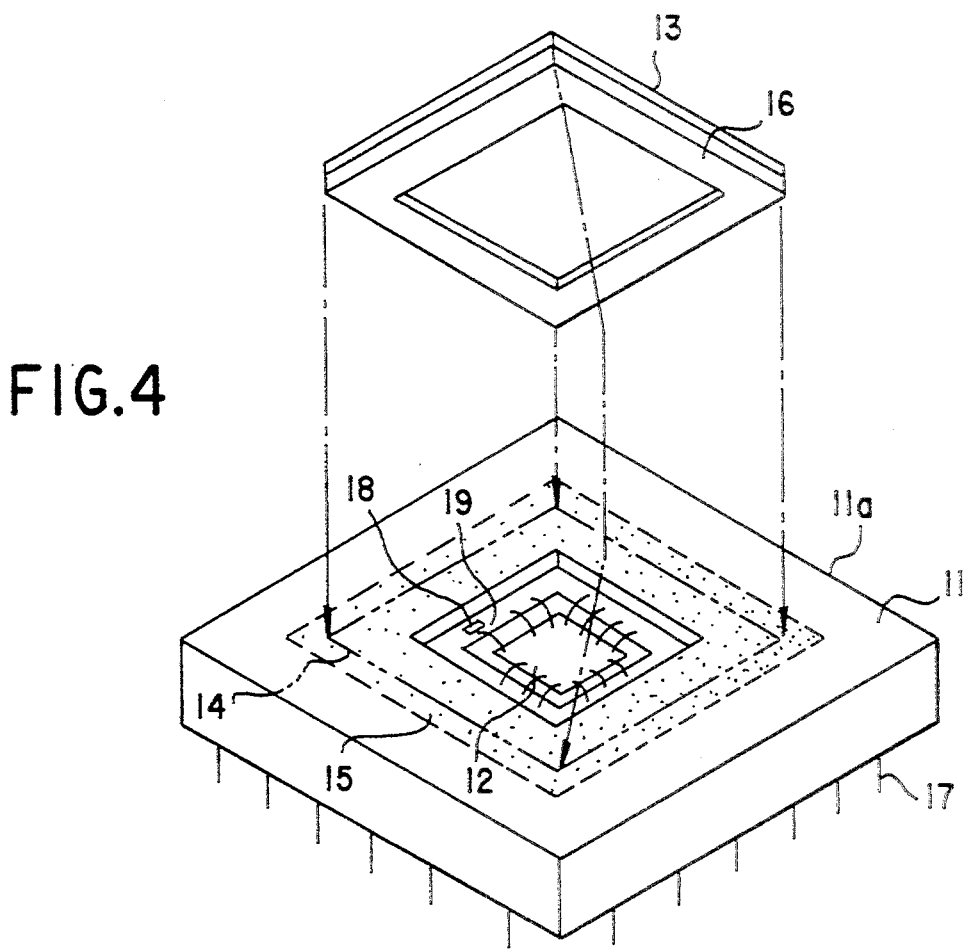
FIG. 4 is a partially exploded perspective view of the semiconductor device shown in FIG. 3.

A description will now be given of a first preferred embodiment of the present invention. Referring to FIGS. 3 and 4, there is illustrated a semiconductor device 10 according to the first preferred embodiment of the present invention. The semiconductor device in FIGS. 3 and 4 has a pin grid array of terminal pins, and a frit type sealing.

The semiconductor device 10 has an alumina package 11, which has a recess portion in a stage surface thereof. A semiconductor chip 12 is accommodated in the recess portion of the alumina package 11 and fixed thereto by using, for example, gold, gold-silicon, silver epoxy resin, silver polyimid resin or silver glass. When gold-silicon is used, a gold is plated on the recess portion of the alumina package 11. It is preferable that the semiconductor chip be fixed to the package 11, as will be described later. A lid 13 formed of a ceramic substance, such as alumina, is positioned at a lid mounting portion 14 of a stage surface 11a of the alumina package 11, and hermetically seals the semiconductor chip 12. In FIG. 4, the lid mounting portion 14 is indicated by the two-dot chain line. An alumina paste layer (intermediate layer) 15 is coated on a portion of the stage surface 11a which includes the lid mounting portion 14 and which is wider than the lid mounting portion 14. A plurality of pin (lead) terminals 17 which are electrically coupled to inner patterns 18 on the stage surface of the alumina package 11 extend from the alumina package 11. The inner patterns are electrically connected to integrated circuits formed on the semiconductor chip 12 via bonding wires 19.

The alumina paste layer 15 is formed of a paste which contains alumina ($Al_2O_3$) and glass. For example, an alumina paste contains a mixture of alumina particles having diameters between 5 $\mu$m and 6 $\mu$m, and a glass component. Such an alumina paste is printed on the above-mentioned portion of the stage surface 11a by a conventional screen printing process. The printed alumina paste layer has a thickness of, for example, 30 $\mu$m. After that, the printed alumina paste layer is sintered at a temperature between 1500° C. and 1600° C. for a few hours. The alumina paste layer after it is sintered is about 20 $\mu$m thick. The alumina paste layer 15 is formed in the above-mentioned way.

The surface of the alumina paste layer 15 has a center line average roughness Ra between about 0.5 and 0.8. The roughness of the surface of the alumina paste layer 15 is approximately twice that of the stage surface 11a of the package 11. This results from fact that the stage surface 11a of the package 11 is smoothed due to the function of a pressure which is applied during a process in which a plurality of alumina layers of the alumina package 11 are stacked. On the other hand, roughness of the surface of the alumina paste layer 15 is created due to the use of a mesh mask during the screen printing process and the fact that no pressure is applied during the formation of the alumina paste layer 15. It should be noted that even when alumina particles having diameters substantially identical to those of alumina particles used for forming the alumina package, the surface of the alumina paste layer 15 becomes rougher than that of the alumina package 11. If alumina particles having diameters (in the range of, for example, 5 $\mu$m to 6 $\mu$m) larger than alumina particles used for forming the alumina package 11 are used for forming the alumina paste layer 15, the surface roughness of the alumina paste layer 15 will be enhanced. The above holds true for other ceramic particles.

However, it is preferable that in the following cases, alumina particles having diameters larger than those for the alumina package 11 be used for forming the alumina paste layer 15. For example, there is a case where the lid 13 is placed at an intermediate step portion of the alumina package 11. The top surface of the alumina package is coupled, via one or more intermediate step portions, to the bottom surface thereof where the semiconductor chip 12 is placed. It is impossible to coat an alumina paste on the intermediate step portion of the alumina package 11 at the last production step. In this case, an alumina paste is coated on the intermediate step portion, and thereafter, the top alumina layer is placed on the intermediate portion and sintered. During the above step, a pressure is applied to the alumina paste layer formed on the intermediate portion, so that a sufficient surface roughness of the alumina paste layer cannot be obtained. In this case, by forming the alumina paste layer of alumina particles having larger diameters, a sufficient surface roughness thereof can be obtained. Further, the following case should use alumina particles having larger diameters to form the alumina paste layer. If the alumina package 11 and the alumina paste layer 15 are formed of very fine alumina particles, a sufficient surface roughness of the alumina paste layer 15 will not be obtained even if it is formed by the screen printing process. In this case, it is preferable to form the alumina paste layer of alumina particles having diameters much larger than those of very fine alumina particles.

Figure 2:
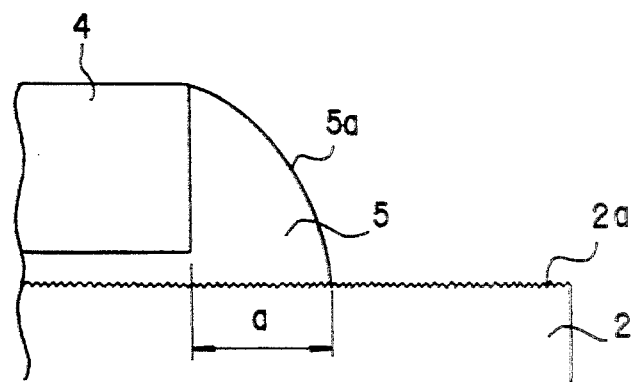
FIG. 2 is an enlarged side view of a portion surrounded by the chain line shown in FIG. 1.
Figure 5:
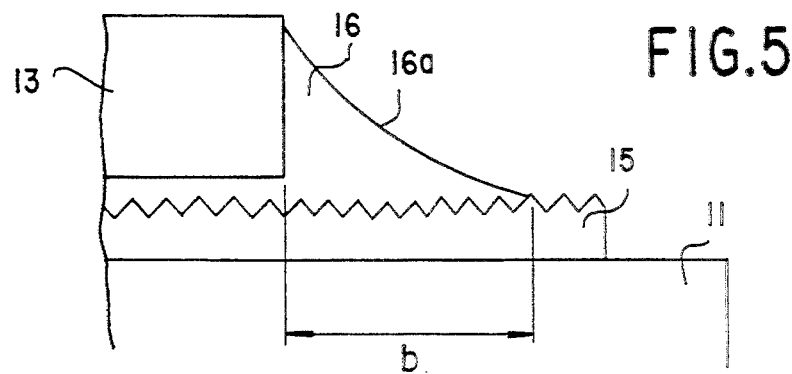
FIG. 5 is an enlarged view of a portion of the semiconductor device shown in FIG. 3.

A glass layer 16 is formed by melting glass and solidifying melted glass. The glass layer 16 functions as a sealing member, and is interposed between the lid 13 and the package 11. A surface of the glass layer 16 on the side of the alumina package 11 is adhered to the corresponding surface of the alumina paste layer 15. It is confirmed that glass has a good liquidity on an alumina paste layer, as compared with a ceramic layer. Thus, the glass layer 16 expands on the alumina paste layer 15 very well during the melting process and, as shown in FIG. 5, a large meniscus portion 16a of the glass layer 16 is obtained. It will be noted that the meniscus portion 16a, that is, the outer surface of the glass layer 16a is concave. As a result, the length 'b' of a portion of the glass layer 16 outward extending from the edge of the lid 13 due to the capillary action is much greater than the aforementioned length 'a' shown in FIG. 2.

Figure 1:
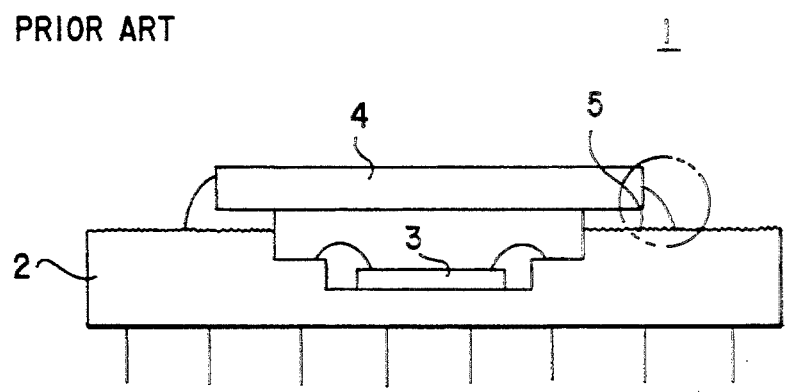
FIG. 1 is a cross-sectional view of a conventional semiconductor device.

Table 1 shows the results of the aforementioned thermal shock test to the conventional device 1 (FIG. 1) and the device 10 (FIG. 3) according to the first preferred embodiment of the present invention.

TABLE 1

| Number of times that thermal shocks are applied | 100 | 200 | 300 | 1000 | 2000 |
|---|---|---|---|---|---|
| Device 10 (Ra = 0.5–0.8) | 0/10 | 0/10 | 0/10 | 0/10 | 0/10 |
| Device 1 (Ra = 0.3–0.4) | 0/20 | 0/20 | 19/20 | ... | ... |

In table 1, 0/10 means that 10 samples did not have any cracks at all, and 19/20 means that cracks occurred in 19 of 20 samples. It can be seen from Table 1 that none of the 10 samples of the device 10 did not have any cracks at all even after the thermal shocks were repeatedly applied thereto 2000 times. On the other hand, cracks took place in 19 samples of the 20 samples of the device 10 after the thermal shocks were repeatedly applied thereto only 300 times. It can be concluded that the use of the alumina paste layer 15 extremely improves resistance to thermal shocks.

It is considered that the above-mentioned excellent advantages of the semiconductor device 10 are due to the following reasons. First, since the surface of the alumina paste layer 15 is rough, a great anchor effect between the glass layer 16 and the alumina paste layer 15 can be obtained. Second, since the alumina paste layer 15 has a large roughness of surface, the adhesion area in which the glass layer 16 and the alumina paste layer 15 are adhered to each other is increased. Third, since the length 'b' of the outward extending portion of the glass layer 16 is much greater than the length 'a' of the outward extending portion of the glass layer 5, the adhesive area is also increased, so that the meniscus portion 16a of the glass layer 16 becomes concave. The adhesion strength of the glass layer 16 with respect to the alumina paste layer 15 (alumina package 11) is increased due to the increased anchor effect and the increased adhesion area. Additionally, it becomes easy to position the lid 13 on the alumina package 11, since it is sufficient to position the lid 13 with respect to the peripheral edges of the alumina paste layer 15. When the lid 13 is adhered to the alumina package 11, glass is heated so that it is melted. During the heating process, the alumina paste layer 15 is resistant to such heating, so that there is no problem.

It may be possible to employ an alternative in which the alumina package 11 is formed of ceramic particles having diameters larger than normal diameters. In this case, it is possible to obtain a large roughness of the surface of the alumina package 11 after it is sintered. However, in this case, the strength of the alumina package 11 will deteriorate and the contraction ratio thereof will vary. For these reasons, the above-mentioned alternative is not practical. On the other hand, when ceramic particles having diameters smaller than normal diameters are used for forming the alumina package 11 in order to increase the strength thereof, the surface of the alumina package 11 has a small roughness after it is sintered. In this case, the alumina paste layer 15 containing ceramic particles having diameters larger than those of the alumina package 11 functions as if the surface of the alumina package 11 has a large roughness.

It is possible to replace the alumina paste layer 15 by another layer formed of a paste substance. In this case, it is important to select the material of the paste layer 15 so that the paste layer 15 has a major component which is the same as that of the package 11. For example, when the package 11 is formed of aluminum nitride (AlN) and glass, the paste layer 15 is formed of a paste of aluminum nitride. When the package is formed of mullite ($Al_6Si_2O_{13}$), the paste layer 15 is formed of a mullite paste.

The paste layer 15 may consist of a plurality of stacked layers, as will be described later. It is possible to coat a paste layer on a surface portion of the lid in contact with the glass layer 16, as will be described later. In this case, the adhesive strength of the lid 13 with respect to the alumina package 11 increases, so that the semiconductor device becomes more resistant to thermal shocks.

Figure 6:
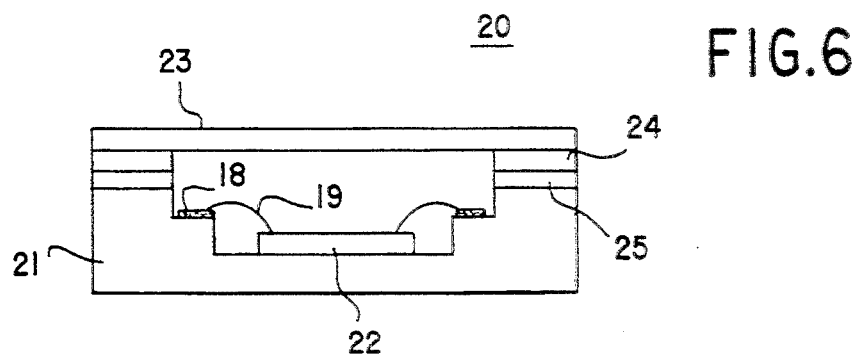
FIG. 6 is a cross-sectional view of another semiconductor device according to the first preferred embodiment of the present invention.
Figure 7:
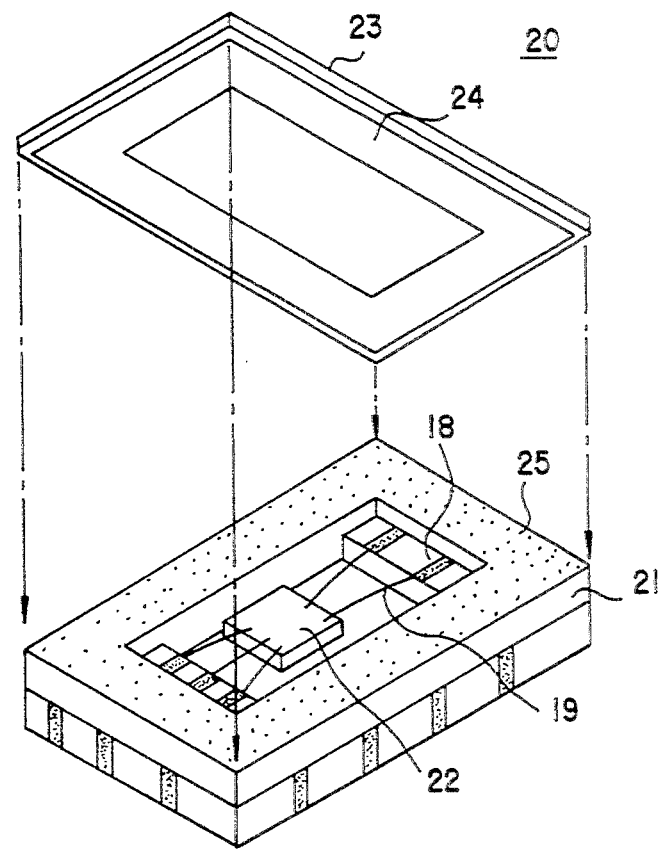
FIG. 7 is a perspective view of the semiconductor device shown in FIG. 6.

Referring to FIGS. 6 and 7, there is illustrated another semiconductor device 20 according to the first preferred embodiment of the present invention. The semiconductor device 20 in FIGS. 6 and 7 is an LCC (leadless chip carrier) type semiconductor device. The semiconductor device 20 has a glass epoxy resin package 21 having a recess portion formed on a stage surface in which a semiconductor chip 22 is accommodated. The semiconductor chip 22 is adhered to the package 21 by, for example, a silver epoxy resin, preferably according to a sixth preferred embodiment of the present invention. A lid 23 is formed of glass or glass epoxy resin. An epoxy adhesive 24 is coated on a peripheral area of a lower surface of the lid 23. A solder resist layer 25 is formed on the stage surface of the package 21 by printing an epoxy-based solder resist by the screen printing process and by curing it at a temperature between 140° C.–150° C. The cured solder resist layer 25 is, for example, 10–30 μm thick. The surface of the solder resist layer 25 has a center line average roughness Ra in the range of 1.0 to 4.0. Such a roughness of the surface is much greater than that of the glass epoxy resin package 21. The lid 23 is adhered to the stage surface of the package 21 by the epoxy adhesive 24. The use of the solder resist layer 25 enhances the adhesive strength between the epoxy adhesive 24 and the package 21, so that the semiconductor device 20 has an improved thermal shock resistant characteristic. It is further possible to coat the solder resist layer 25 on the portion of the lower surface of the lid 23 in contact with the epoxy adhesive 24. This will further increase the adhesive strength and thermal shock resistance.

Figure 8:
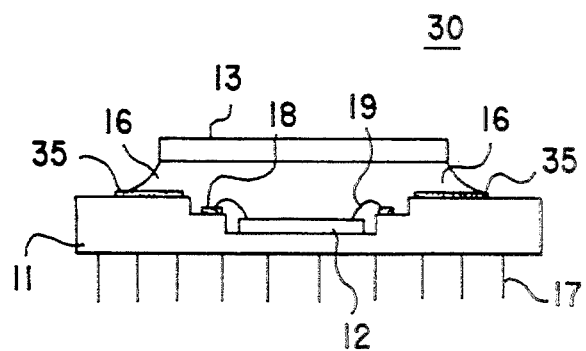
FIG. 8 is a cross-sectional view of a semiconductor device according to a second preferred embodiment of the present invention.

A description will be given of a semiconductor device 30 according to a second embodiment of the present invention with reference to FIG. 8, in which those parts which are the same as those shown in FIG. 3 are given the same reference numerals. An alumina paste layer 35 shown in FIG. 8 is substituted for the alumina paste layer 15 shown in FIG. 3. The alumina paste layer 35 is formed by once coating, on the stage surface of the alumina package 11, a material having a coefficient of thermal expansion different from that of the package 11 and that of the glass layer 16. That is, the alumina paste layer 35 stepwise absorbs the difference between the coefficient of thermal expansion of the alumina package 11 and the coefficient of thermal expansion of the glass layer 16.

Generally, the coefficient of thermal expansion of alumina is determined based on the ratio of alumina to glass contained therein. Thus, it is possible to change the coefficient of thermal expansion of alumina by changing the above ratio. For example, when alumina contains alumina by 60% and borosilicate lead glass by 40%, the coefficient of thermal expansion of such alumina is approximately equal to $5.4 \times 10^{-6}/°$ C. Thus, the alumina paste layer 35 is provided at a weak adhesive portion between the glass layer 16 and the package 11, that is, at a portion having a large difference of the coefficients of thermal expansion. In other words, the alumina paste layer 35 functions as a buffer layer provided between the different coefficients of thermal expansion.

For example, the coefficient of thermal expansion of the alumina package 11, $\alpha_1$, is equal to $7.6 \times 10^{-6}/°$ C., the coefficient of thermal expansion of the glass layer 16, $\alpha_2$, is equal to $6.9 \times 10^{-6}/°$ C., and the coefficient of thermal expansion of the lid 13, $\alpha_3$, is equal to $7.2 \times 10^{-6}/°$ C. Thus, the difference between the coefficients of thermal expansion obtained at an interface between the lid 13 and the glass layer 16, $\Delta 1$ ($=\alpha_3-\alpha_2$), is equal to $0.3 \times 10^{-6}/°$ C., and the difference between the coefficients of thermal expansion obtained at an interface between the glass layer 16 and the package 11, $\Delta 2$ ($=\alpha_1-\alpha_2$), is equal to $0.7 \times 10^{-6}/°$ C. That is, the difference at the interface between the glass layer 16 and the package 11 is greater than that at the interface between the lid 13 and the glass layer 16. With the above in mind, the coefficient of thermal expansion of the alumina paste layer 35, $\alpha_4$, is set to, for example, $7.25 \times 10^{-6}/°$ C. In this case, the following coefficient-of-thermal-expansion differences are obtained: $\Delta 3 = \alpha_1 - \alpha_4 = 0.35 \times 10^{-6}/°$ C., and $\Delta 4 = \alpha_4 - \alpha_2 = 0.35 \times 10^{-6}/°$ C. As a result, the resistance to thermal shocks is enhanced.

Generally, in order to modify the quality of alumina forming the package, it is necessary to match it with the quality of the glass layer 16 in view of mechanical properties (such as a bending strength), electrical properties (such as dielectric constant, dielectric dissipation factor, volume resistivity, brakedown voltage), and other properties (such as thermal conductivity). According to the second embodiment of the present invention, the alumina paste layer 35 is coated on only portions which are sealed by the lid 13, and the coefficient of thermal expansion is stepwise or substantially gradually varied between the glass layer 16 and the package 11, so that the sealing properties obtained between the package 11 and the lid 13 can easily be improved.

Figure 9:
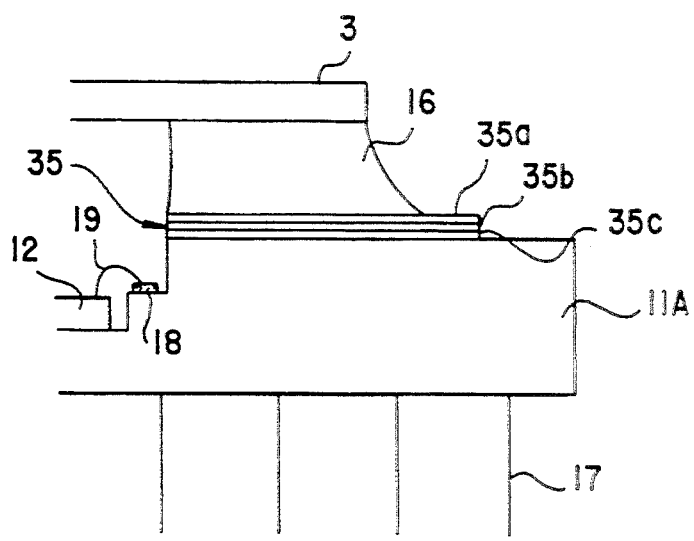
FIG. 9 is an enlarged view of a part of the semiconductor device shown in FIG. 8.

Referring to FIG. 9, there is illustrated a variation of the second embodiment of the present invention. The semiconductor device in FIG. 9 has a package 11A formed of a high terminal conductivity ceramic material, such as aluminum nitride (AlN). There is a large difference between the coefficient of such a high terminal conductivity ceramic material and that of the glass layer 16 formed of low-melting-point glass, and thus, a problem will occur regarding the adhesion between the package 11A and the lid 13. It will be noted that the coefficient of thermal expansion of aluminum nitride is about $5.0 \times 10^{-6}/°$ C., and that of the glass layer 16 is about $6.9 \times 10^{-6}/°$ C.

With the above fact in mind, the buffer layer 35 between the aluminum nitride package 11A and the glass layer 16 is modified so that it consists of three layers 35a, 35b and 35c respectively containing alumina and glass. The layers 35a, 35b and 35c have mutually different coefficients of thermal expansion as follows. That is, the coefficient of thermal expansion of the layer 35a in contact with the glass layer 16 is the largest, and that of the layer 35c in contact with the alumina nitride package 11a is the smallest. The coefficient of thermal expansion of the layer 35b is an intermediate value between the coefficients of thermal expansion of the layers 35a and 35b. The coefficient of thermal expansion of the layer 35a is smaller than that of the glass layer 16, and the coefficient of thermal expansion of the layer 35c is greater than that of the aluminum nitride package 11A. The buffer layer 35 functions to absorb the difference between the coefficients of thermal expansion of the glass layer 16 and the aluminum nitride package 11A. It should be noted that the buffer layer 35 is not limited to the above three layers, but may have an arbitrary number of layers. It will be noted that the layers 35a and 35b and 35c are formed by performing the screen printing process three times.

Figure 10:
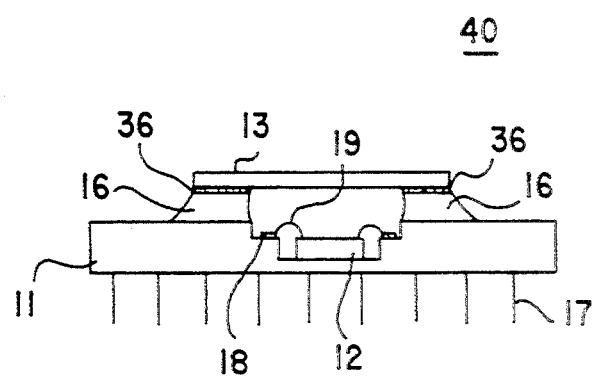
FIG. 10 is a cross-sectional view of a semiconductor device according to a third preferred embodiment of the present invention.

Referring to FIG. 10, there is illustrated a semiconductor device 40 according to a third preferred embodiment of the present invention. In FIG. 10, those parts which are the same as those shown in FIG. 3 are given the same reference numerals. An alumina paste layer 36 is provided between the lid 13 and the glass layer 16. The alumina paste layer 36 has a surface having a center line average roughness between 0.5 and 0.8. The alumina paste layer 36 contains alumina and glass so that the coefficient of thermal expansion thereof, $\alpha_5$, is equal to about $7.05 \times 10^{-6}/°$ C. As a result, $\Delta 5 = \alpha_3 - \alpha_5 = 0.15 \times 10^{-6}/°$ C., and $\Delta 6 = \alpha_5 - \alpha_2 = 0.15 \times 10^{-6}/°$ C. With this arrangement, a gradual change of the coefficient of thermal expansion can be obtained between the glass layer 16 and the lid 13, so that the adhesion therebetween can be improved.

Figure 11:
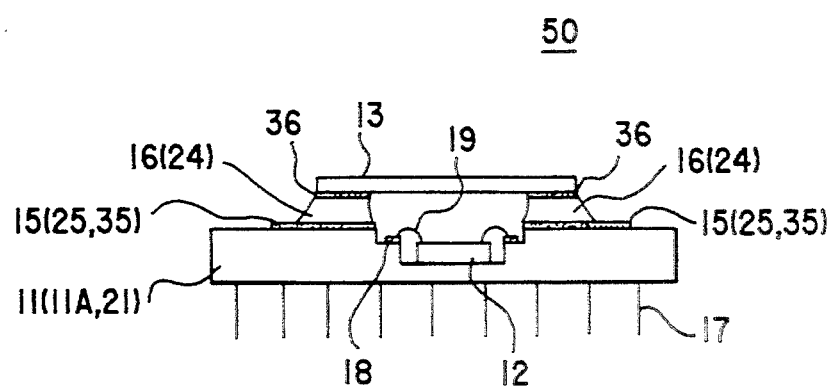
FIG. 11 is a cross-sectional view of a semiconductor device according to a fourth preferred embodiment of the present invention.

Referring to FIG. 11, there is illustrated a semiconductor device 50 according to a fourth embodiment of the present invention, in which those parts which are the same as those shown in the previous figures are given the same reference numerals. The semiconductor device 50 corresponds to the combination of the first and second (third) embodiment of the present invention. The alumina paste layer 15 (25, 35) is provided between the package 11 (11A) and the glass layer 16, and the alumina paste layer 36 is provided between the glass layer 16 and the lid 13. The structure shown in FIG. 11 will have the most effective adhesion between the package 11 (11A), the glass layer 16 and the lid 13.

It will be noted that the structures shown in FIGS. 8 through 10 can be applied to semiconductor devices having a glass epoxy resin package, as shown in FIGS. 6 and 7. That is, the alumina paste layer 35 shown in FIGS. 8 and 9 is replaced by a solder resist layer 25, and the alumina paste layer 36 shown in FIG. 10 is replaced by a solder resist layer.

Figure 12:
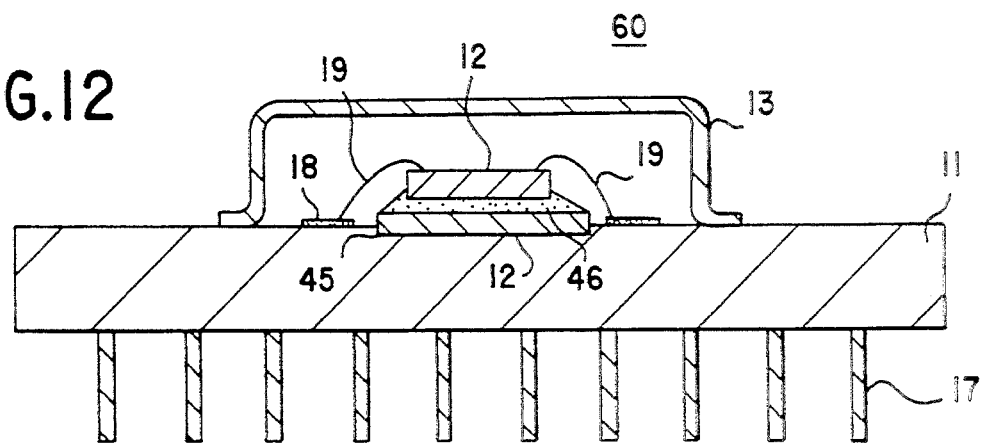
FIG. 12 is a cross-sectional view of a semiconductor device according to a fifth preferred embodiment of the present invention.

A description will now be given of a semiconductor device 60 according to a fifth embodiment of the present invention with reference to FIG. 12, in which those parts which are the same as those shown in the previous figures are given the same reference numerals. In FIG. 12, the member 13 is referred to as a cap. According to the fifth embodiment of the present invention, an alumina paste layer 46 is provided between the alumina package 11 and a silver (Ag) glass layer 19, on which the semiconductor chip 12 is mounted.

It will be noted that conventionally, gold-silicon has an eutectic temperature of 370° C. The alumina package 11 on which gold is coated is heated at a temperature higher than 370° C., so that eutectic gold-silicon is formed between gold plating and silicon chip, and the semiconductor chip 12 is fixed on the stage surface of the alumina package 11. It will be noted that as the chip size increases, the semiconductor chip 12 is greatly warped. A warp of the semiconductor chip 12 deteriorates the adhesion between the semiconductor chip 12 and the alumina package 11. In which case, a void will be liable to occur in the gold-silicon layer 46, and a stress concentration will occur around the void. Thus, the residual stress and thermal stress will increase. In the worst case, a crack will take place in the semiconductor chip 12.

In order to eliminate the above-mentioned problems, conventionally, a pellet (thin piece) member made of gold (Au) or gold-silicon (Au-Si) is provided between the semiconductor chip 12 and the alumina package 11, or a substance having a small Young's modulus, such as a silver epoxy resin, silver polyimid resin, silver glass or aluminum glass, is provided therebetween. However, the use of such a pellet member, particularly containing gold, increases the production cost, and the use of the above substance does not provide a good liquidity and good meniscus. The fifth embodiment of the present invention using a ceramic paste layer 45 overcomes these problems.

The alumina paste layer 45 is formed by coating a paste composed of alumina and glass by the screen printing process and sintering it at a temperature of about 1500° C.–1600° C. As has been described previously, the alumina paste layer 45 after it is sintered is about 20 μm thick, and a surface having a roughness between 0.5 and 0.8. It is preferable that the alumina paste layer 45 have a coefficient of thermal expansion between that of silicon of the semiconductor chip 12 (which is approximately equal to $3.5-4\times10^{-6}$) and alumina of the alumina package 11 (which is approximately equal to $7\times10^{-6}$). The silver glass layer 46 is formed on the alumina paste layer 45 by a dispensing process. It is preferable to use silver glass in view of the production cost.

Figure 13:
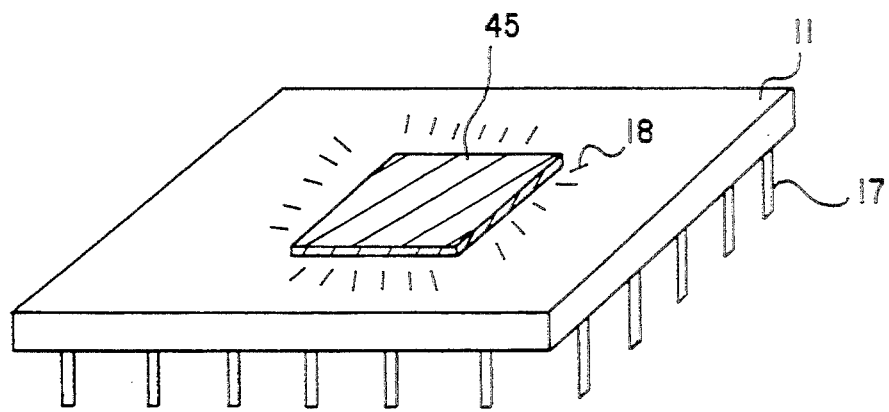
FIG. 13 is a perspective view of a package shown in FIG. 12.

FIG. 13 is a perspective view of the alumina package 11 shown in FIG. 12. The alumina package 11 has a dimension of 35 mm×35 mm and a thickness of 2 mm, for example. The alumina paste layer 45 also functions as an alignment mark which is used in the chip bonding process. It is possible to modify the alumina paste layer 45 so that it consists of a plurality of stacked layers.

The use of the alumina paste layer 45 increases the adhesion between the semiconductor chip 12 and the alumina package 11, since the alumina paste layer 45 has an increased roughness which increases the anchor effect and meniscus. Further, the use of the alumina paste layer 45 relaxes the stress occurring when the semiconductor chip 12 is fixed to the alumina package 11 since it has a coefficient of thermal expansion between that of the semiconductor chip 12 and that of the alumina package 11.

Figure 14:
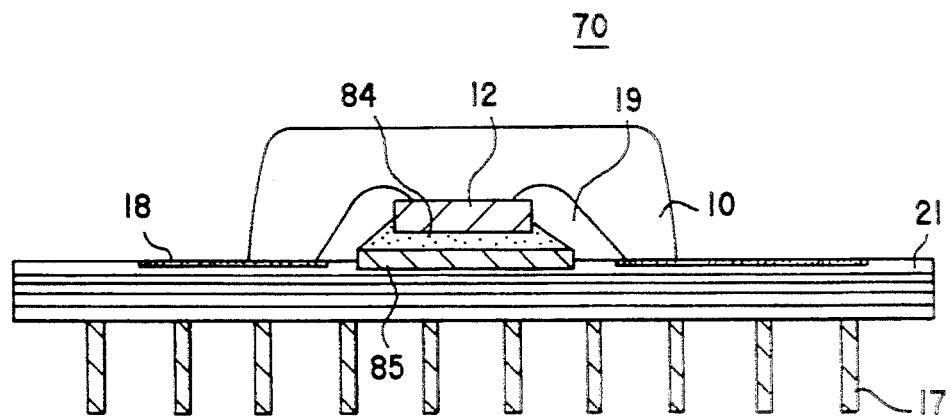
FIG. 14 is a cross-sectional view of another semiconductor device according to the fifth preferred embodiment of the present invention.

Referring to FIG. 14, there is illustrated a PGA type semiconductor device 70 according to the fifth preferred embodiment of the present invention. The semiconductor device 70 has the glass epoxy resin package 21. A solder resist layer 85 formed of an epoxy-based solder resist is coated on the package 21 by the screen printing process, and is cured at about 150° C. The solder resist layer 85 has a heat resistance up to only about 200° C., and is thus used when the package 21 is formed of a material having a low heat resistance, such as a resin package or mold package. The solder resist layer 85 has a surface roughness so that Ra=1.0–4.0. It is preferable that the solder resist layer 85 have a coefficient of thermal expansion so that it is between that of silicon and that of the package 21.

The present invention is not limited to the specifically disclosed embodiments, and variations and modifications may be made without departing from the scope of the present invention. For example, the present invention includes a ceramic or resin type dual in-line package (DIP) and a ceramic or resin type flat package (FP).

What is claimed is:

1. A method of producing a semiconductor device, comprising the steps of:
    forming, by a screen printing process, a paste on a predetermined area of a package having a semiconductor chip mounted thereon, said paste containing a material which is a same material as said package;
    sintering said paste at a predetermined temperature, so that a roughened surface layer is formed on said predetermined area of said package; and
    adhering a cap to said roughened surface layer by using an adhesive provided between said roughened surface layer and said cap.

2. A method as claimed in claim 1, wherein the material contained in said paste comprises alumina.

3. A method as claimed in claim 2, wherein said paste comprises glass in addition to said alumina.

* * * * *